United States Patent [19]

Orenstein et al.

[11] Patent Number: 5,031,187
[45] Date of Patent: Jul. 9, 1991

[54] PLANAR ARRAY OF VERTICAL-CAVITY, SURFACE-EMITTING LASERS

[75] Inventors: Meir Orenstein, Old Bridge; Ann C. Von Lehmen, Little Silver, both of N.J.

[73] Assignee: Bell Communications Research, Inc., Livingston, N.J.

[21] Appl. No.: 480,117

[22] Filed: Feb. 14, 1990

[51] Int. Cl.$^5$ .............................................. H01S 3/19
[52] U.S. Cl. ........................................ 372/50; 372/45
[58] Field of Search ............................. 372/50, 45, 99

[56] References Cited

U.S. PATENT DOCUMENTS

| | | | |
|---|---|---|---|
| 3,897,273 | 7/1975 | Marsh et al. | 148/1.5 |
| 3,983,509 | 9/1976 | Scifres et al. | 331/94.5 |
| 4,309,670 | 1/1982 | Burnham et al. | 331/94.5 |
| 4,341,570 | 7/1982 | Landreau et al. | 148/1.5 |
| 4,523,961 | 6/1985 | Hartman et al. | 148/1.5 |
| 4,949,350 | 8/1990 | Jewell et al. | 372/45 |

FOREIGN PATENT DOCUMENTS

| | | | |
|---|---|---|---|
| 0097684 | 5/1985 | Japan | 372/45 |
| 0046996 | 2/1989 | Japan | 372/45 |

OTHER PUBLICATIONS

Tai et al., "Room Temperature Continuous-Wave Vertical-Cavity Surface-Emitting GaAs Injection Laser", Appl. Phys. Letts., 55(24) Dec. 11, 1989, pp. 2473-2475.
K. Tai et al, "Use of implant isolation for fabrication of vertical cavity surface emitting laser diodes," Electronics Letters, vol. 25, Nov. 1989, pp. 1644-1645.
Yang et al, "Monolithic two dimensional surface emitting arrays of GaAs/AlGaAs Lasers,"Proceedings of SPIE, Oct. 1988, vol. 893, pp. 181-187.
Iga et al, "Surface emitting semiconductor laser array: Its advantage and future,"Journal of Vacuum Science Technology A, vol. 7, May/Jun. 1989, pp. 842-846.
Jewell et al, "Low-Threshold Electrically Pumped Vertical-Cavity Surface-Emitting Microlasers,"Electronics Letters, Aug. 1989 vol. 25, pp. 1123-1124.
Orenstein et al, "Vertical Cavity Laser Arrays with Planar Lateral Confinement," 1989, Postdeadline Paper, Optical Society of America, Oct. 1989 Annual Meeting, PD22.

Primary Examiner—Georgia Epps
Attorney, Agent, or Firm—James W. Falk; Charles S. Guenzer

[57] ABSTRACT

A planar array of vertical-cavity, surface-emitting diode lasers, and its method of making. The device comprises an active region having a quantum well region disposed between two Bragg reflector mirrors separated by a wavelength of the emitting laser. A large area of this structure is grown on a substrate and then laterally defined by implanting conductivity-reducing ions into the upper mirror in areas around the lasers. Thereby, the laterally defined laser array remains planar. Such an array can be made matrix-addressable by growing the structure on a conducting layer overlying an insulating substrate. After growth of the vertical structure, an etch or further implantation divides the conducting layer into strips forming bottom column electrodes. Top row electrodes are deposited in the perpendicular direction over the laterally defined top mirrors.

9 Claims, 3 Drawing Sheets

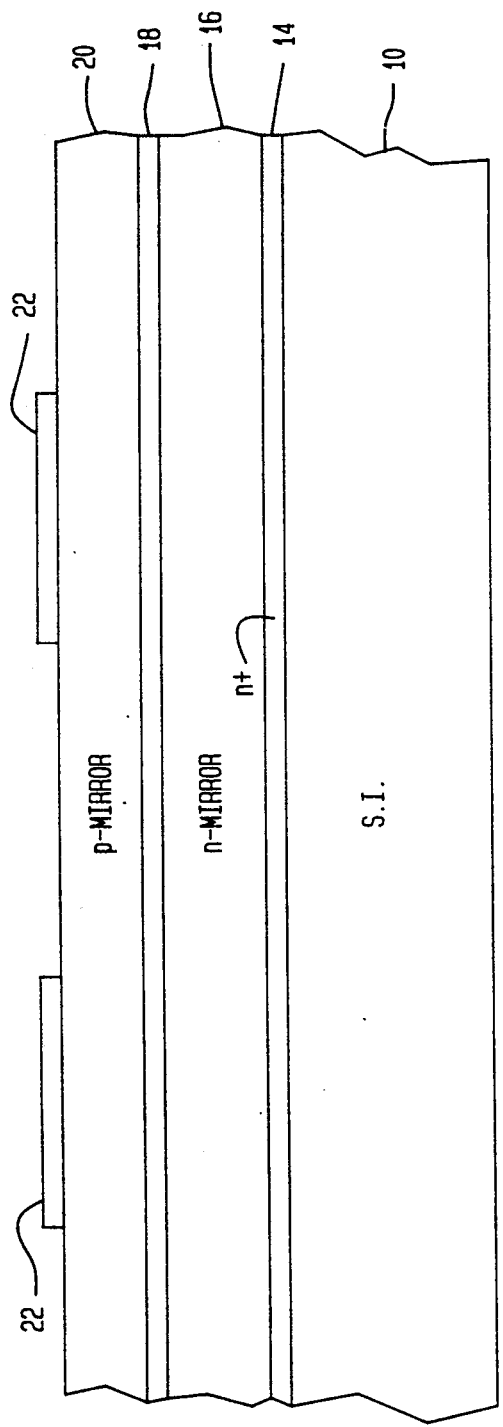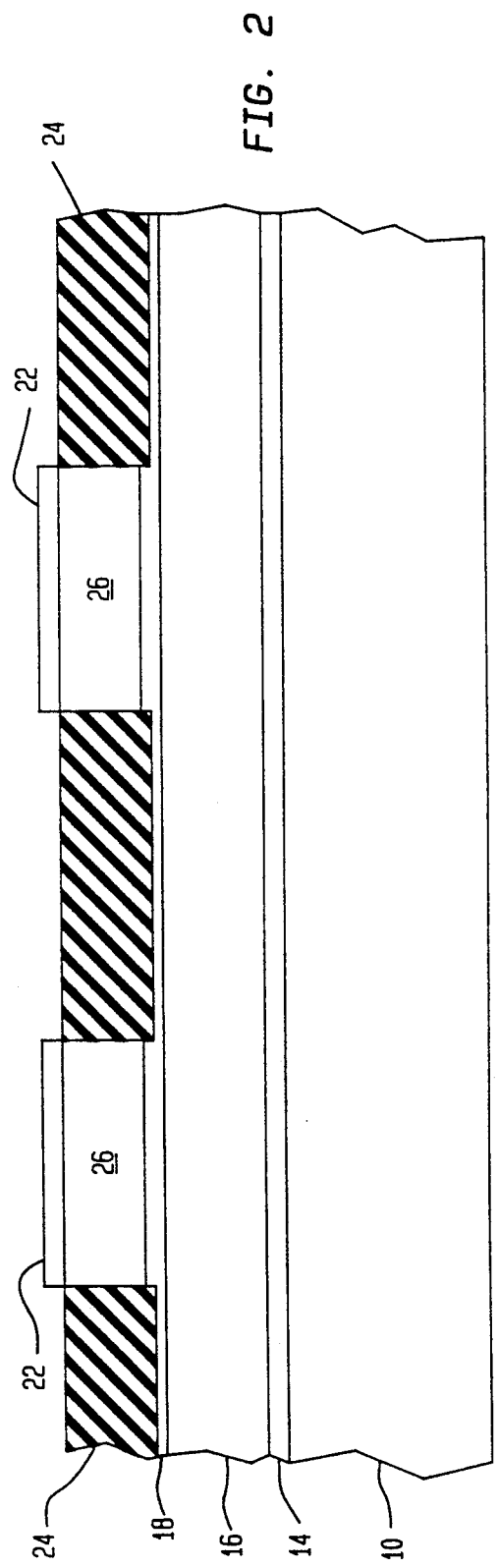

PLANAR ARRAY OF VERTICAL-CAVITY, SURFACE-EMITTING LASERS

GOVERNMENT INTEREST

This invention was made partially with Government support under Contract DAAL01-89-C-0900 awarded by the Department of the Army. The Government has certain rights in this invention.

FIELD OF THE INVENTION

The invention relates in general to lasers. In particular, it relates to two-dimensional arrays of surface-emitting semiconductor lasers.

BACKGROUND OF THE INVENTION

Semiconductor lasers are the subject of a well developed technology and have been incorporated into many commercial products. Further, there has been much work in the development of one-dimensional arrays of semiconductor lasers integrated into a single integrated circuit chip. These one-dimensional arrays are arranged such that the resonant cavities of the lasers extend horizontally in parallel along the surface of an integrated circuit chip. In the usual embodiments, the laser light is emitted from a side facet of the IC chip. However, there are known embodiments in which the light outputs of the horizontal cavities are reflected or Bragg diffracted to become perpendicular to the surface of the chip, that is, to be surface-emitting. It is possible to have two-dimensional arrays of Bragg diffracted or reflected, horizontal-cavity lasers, as has been disclosed by Yang et al in a technical article entitled "Monolithic two dimensional surface emitting arrays of GaAs/AlGaAs lasers" appearing in Proceedings of SPIE, volume 893, 1988, at pages 181-187. This article discusses a variety of two-dimensional arrays of surface-emitting semiconductor lasers.

There has been considerable effort in developing vertical-cavity, surface-emitting lasers, as has been discussed by Iga et al in a technical article entitled "Surface emitting semiconductor laser array: Its advantage and future" appearing in Journal of Vacuum Science Technology A, volume 7, 1989, at pages 842-846. The laser diodes discussed therein suffer the disadvantages of requiring regrowth for current confinement and etching through of the substrate in order to deposit a mirror on the bottom of the epitaxially grown cavity structure.

Jewell et al have disclosed a two-dimensional array of vertical-cavity, surface-emitting diode lasers in U.S. Pat. No. 4,949,350 incorporated herein by reference. These arrays have been further reported by Jewell et al in a technical article entitled "Low-threshold electrically pumped vertical-cavity surface-emitting microlasers" appearing in Electronics Letters, volume 25, 1989 at pages 1123-1124. The Jewell et al laser arrays required neither etch-through nor regrowth. Jewell et al grew on a substrate a horizontally uniform, vertical-cavity laser structure. The lasing active region was located between epitaxially grown semiconductor end mirrors, separated by the lasing wavelength. The mirrors were stacks of quarter-wavelength thick layers of semiconductor materials of differing refractive indices, thereby acting as Bragg reflectors. The uniform laser structure was further defined into an array of lasers by ion-beam assisted chemical etching which removed horizontal portions of the laser structure to leave an array of pillars rising approximately 5 $\mu$m above the substrate. Each pillar, which was a separate laser, had a diameter of a few micrometers or more and the pillars were separated by similar distances. The conducting substrate served as one common electrode and the tops of the individual pillar lasers were coated with a metallic layer which served as a selectable electrode for the individual laser among many lasers in the array. Current flowed between the two electrodes vertically through the mirrors, the cavity and the active layer. The substrate, although electrically conducting, was transparent to the laser light so that the light was emitted through the planar bottom surface of the chip, that is, the lasers were surface-emitting lasers.

In the original experiment work of Jewell et al, the electrical contact to the top of the pillars was made with a micro-probe to effect the selection of different ones of the lasers. Most apparently, a permanent type of electrical lead is required for the tops of the pillars. In most semiconductor fabrication, a surface electrical lead is provided by vapor depositing aluminum or other conducting material between the two points to be connected. The surface topography is usually gentle enough that the lead material can be smoothly deposited over the transition from one vertical level to another. However, Jewell et al achieved their extremely dense laser array by milling precisely vertical walls to form a high aspect-ratio pillar, e.g., a 5 $\mu$m high pillar of 2 $\mu$m diameter. Depositing lead material on such a pillar presents a formidable challenge.

A related problem arises from the fact that the lasers have only fractional efficiency in converting electrical current to light. Therefore, a substantial amount of heat is generated in the pillars. Thermal conductivity to the air surrounding the pillars is minimal. The high aspect ratios of the pillars prevent effective heat sinking of the pillars to the substrate. For this reason, CW operation of the laser arrays has been more difficult to achieve than pulsed operation.

There have been suggestions to regrow electrically insulating material in the valleys between the pillars. Such regrowth would provide a degree of planarization so that lead deposition becomes feasible and thermal conduction is improved. Substantial regrowth has not as yet been achieved. It will remain difficult to completely planarize the chip. In any case, the regrowth will be difficult and expensive.

Regardless of how the leads are formed on the vertical-cavity, surface-emitting laser array, a further problem arises. Arrays of 1000$\times$1000 are feasible with the present technology. Each of the $10^6$ lasers can be individually selected if a separate lead is provided to the top of each laser. Such selectivity is desirable for a number of applications. However, $10^6$ separate leads are not feasible. A possible application of a large laser array is for a switchable optical bus or interconnect. A possible size is 32$\times$32. The individual contacting scheme requires 1024 leads, perhaps attainable but expensive.

The same problem arises in semiconductor memory chips. There, the problem is solved by matrix addressing in which the array of elements are arranged in rows and columns. One set of conductors are laid in the row direction and a second set in the column direction. The elements in the array are connected between their respective row conductors and column conductors. To select a particular element, only the row conductor and the column conductor associated with that element are selected. Thereby, only 2N leads are needed for a N×N array. Adapting the Jewell et al array to the usual types of matrix addressing presents many difficulties.

SUMMARY OF THE INVENTION

Accordingly, an object of the invention is to provide a vertical-cavity, surface-emitting laser array that is planar.

Another object of the invention is to provide such an array that can be easily contacted.

Yet a further object of this invention is to provide such an array that can be matrix addressed.

The invention can be summarized as a vertical-cavity, surface-emitting laser array in which a broad area laser structure is horizontally defined by ion beam patterning, at least through the upper mirror region. The implanted ions, preferably protons, increase the resistivity so as to guide the current through at least the upper part of the cavity. In another aspect of the invention, matrix addressing is achieved by first growing a conducting layer on a semi-insulating substrate, onto which the vertical-cavity structure is grown. After ion-implantation isolation down to the active region, either etching or deeper ion implantation isolates stripes of the conducting layer. Column contacts are made to the isolated stripes and row contacts are made by depositing conductive leads perpendicular to the stripes.

BRIEF DESCRIPTION OF THE DRAWING

FIG. 1 is a cross-section of an embodiment of the vertical-cavity, surface-emitting laser of the invention prior to fabrication of the current confining structure.

FIG. 2 is a cross-section of the final product of the vertical-cavity, surface-emitting laser of the invention.

DETAILED DESCRIPTION

Figure 3:
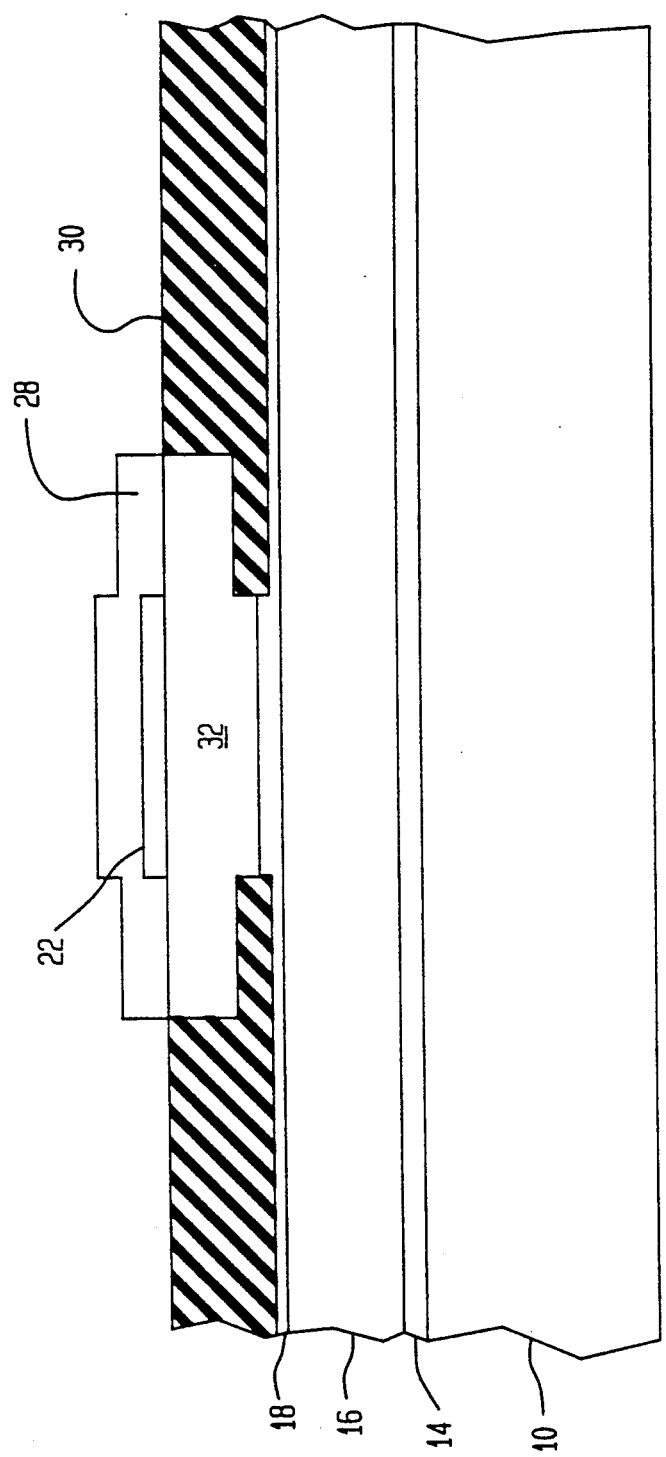
FIG. 3 is a cross-section of another embodiment of the laser of the invention, an improvement over that of FIG. 2.

The present invention achieves a planar array of vertical-cavity surface-emitting diode lasers by defining lateral current confining structure of the vertical-cavity lasers with an ion beam.

In one embodiment of the invention, as illustrated in cross-section in FIG. 1, a laterally unpatterned vertical-cavity laser diode structure was grown by molecular beam epitaxy. A (001)-oriented Cr-doped semi-insulating GaAs wafer of thickness 450 $\mu$m was used for a substrate 10. An n+ layer 14 of GaAs was epitaxially grown on the substrate 10 to a thickness of 1 $\mu$m. It was doped $4\times10^{18}$ cm$^{-3}$ with Si. All crystal growth was by molecular beam epitaxy (MBE). Thereafter, there was grown a vertical-cavity structure comprising an n-type mirror 16, a thin quantum-well active region 18 and a p-type mirror 20. The active region 18 consisted of three $In_{0.2}Ga_{0.8}As$ quantum wells of 8 nm thickness separated by 10 nm GaAs spacers. The composition of the quantum wells would cause emission over a band including the intended laser wavelength $\lambda$ of 940 nm. The mirrors 16 and 20 comprised alternate layers of AlAs and GaAs, each of optical thickness $\lambda/4$. Superlattices were embedded between the alternating mirror layers to smooth the layer interfaces. The n-type mirror 16 was doped with Si and the p-type mirror 20 was doped with Be. The mirrors 16 and 20 defined the ends of a vertical cavity having an optical length $\lambda$. The optical length of the cavity could be any integral number of wavelengths. Unillustrated spacers may be required to provide the required optical length between the mirrors 16 and 18. An unillustrated GaAs cap layer of thickness 10 nm was grown over the cavity structure. The details of the vertical-cavity structure and its fabrication may be found in the patent and article of Jewell et al. The cavity structure had a total of more than 500 layers and a height of approximately 5 $\mu$m.

The substrate 10 was chemically thinned on its backside to a thickness of about 200 $\mu$m and polished by a bromine/methanol solution. Gold electrodes 22 were formed over the vertical-cavity structure with the size and spacing of the intended vertically emitting lasers. The electrodes 22 were formed by depositing a gold layer to a thickness of 0.25 $\mu$m, photolithographically patterning a photoresist layer into a mask over the gold, and removing the gold in the unmasked area by ion milling with Ar ions at 500 eV. The fabrication process to this point did not deviate appreciably from that of Jewell et al although they used a conducting substrate. Further, they did not thin the substrate. Importantly, however, they would at this point then define by an etching process columnar lasers beneath the electrodes 22 by removing areas of the semiconductor not masked by the electrodes. Their chemical etching was assisted by heavy-ion beams and formed vertical walls defined by the electrodes 22.

According to the invention, current confinement was achieved by using the same photoresist mask which was used to define the the electrodes 22 as a mask during ion bombardment with protons. As illustrated in cross-section in FIG. 2, the proton bombardment created insulating regions 24 extending down to the active region 18, a depth of about 2 $\mu$m. The proton bombardment was divided into three stage of high, medium and low acceleration energies. The dose and energy of each stages was selected to achieve high damage extending from the wafer surface to the active region 18. Specifically, a dose of $3\times10^{15}$ cm$^{-2}$ at 200 keV was followed by a dose of $1.5\times10^{15}$ cm$^{-2}$ at 100 keV, followed by a dose of $1.5\times10^{15}$ cm$^{-2}$ at 50 keV. This illustration does not show the lateral range of protons which causes the insulating regions 24 to have curved sides.

A common bottom contact was achieved by chemically etching away an unillustrated portion located away from the lasers down to the level of the n+ layer 14 and depositing a AuGe/Au contact film on the n+ layer 14. The etchant was $H_2O_2:H_2SO_4:H_2O$ (8:1:40, by volume). The individual lasers were contacted on the top either by a micro-probe during the test or by deposited metal leads in operational devices. Laser light was emitted from the bottom surface of the substrate 10.

The proton-induced insulating regions 24 guided the current from the electrode 22 through an isolated mirror region 26 to the area of the active region 18 underlying the electrode 22. Thereby, only that area of the active region 18 emitted light. There appeared to be no appreciable current confinement in the lower, n-type mirror 16, which thereby reduced resistance. It did not appear that the insulating regions 24 provided any light confinement in the lateral directions. However, it would be possible within the limits of the invention to implant with an ion which both reduces the conductivity and decreases the refractive index to thereby also achieve waveguiding, particularly for smaller diameter lasers.

Lasers in the size range of 10×10 to 40×40 μm² were fabricated by the above technique. The 10×10 μm² lasers had a resistance of 100 Ω and a lasing threshold voltage of 4.5 V. The 20×20 μm² lasers had a resistance of 25 Ω and a lasing threshold voltage of 3 V. Lasing was found to occur in a single longitudinal mode at λ=940 nm with a spectral bandwidth of less than 0.05 nm (the limit of the spectrometer). A stable single spatial mode was obtained from the 10 μm laser while lasers larger than 20×20 μm² tended to exhibit filamentary operation.

The lasers operated CW at room temperature. For example the CW threshold current for the 10 μm lasers was about 4 mA with a lasing quantum efficiency of 20%. In pulsed operation, the 40 μm lasers had threshold current of about 17 mA and maximum output power of 45 mW. The characteristics of the 20×20 to 40×40 μm² lasers scaled linearly with their area, indicating no significant deterioration due to the interfaces between the implanted and unimplanted region.

The use of ion implantation to define current confining structure by increasing the resistivity has been disclosed, for example, by Marsh et al in U.S. Pat. No. 3,897,273. The technique has been applied to horizontal cavity lasers, as has been disclosed by Landreau et al in U.S. Pat. No. 4,371,570 and by Hartman et al in U.S. Pat. No. 4,523,961. However, the current transport path in horizontal-cavity lasers is much shorter and wider than in vertical-cavity ones. Therefore, the possible damage in the cavity region produced by implantation is much less important in horizontal-cavity lasers. It is unexpected that the proton-defined lasers would exhibit such high efficiency.

One laser of the laser diode array of another embodiment of the invention is illustrated in cross-section in FIG. 3. The fabrication of the laterally undefined vertical-cavity structure is the same as in the first embodiment. The gold electrode 22 is likewise deposited. However, the photoresist used to define the gold electrode 22 is used as the mask only for the high energy proton implant, here reduced to a fluence of $1\times10^{14}$ cm$^{-2}$. Thereafter, following removal of the photoresist, a p-metal contact 28 is deposited in another photolithographic step. The p-metal contact 28 would have a diameter four to eight times that of the gold electrode 22. It would be composed of Ti/Au and have a thickness of 2 μm. Thereafter, the medium and low energy implantations are performed using the p-metal contact 28 as a mask so as to form insulating regions 30 and conductive isolated regions 32.

In this embodiment, the high-energy implantation produces most of its damage at a depth adjacent the active region 18 since the stopping range of the high-energy implant corresponds to the depth of the active region 18. Thereby, the laser diameter is determined by the diameter of the gold electrode 22. However, a substantial portion of the current path through the upper mirror occurs over the larger diameter portion of the isolated region 32 defined by the p-metal contact 28. Thereby, the resistance is reduced and the efficiency is further increased.

Figure 4:
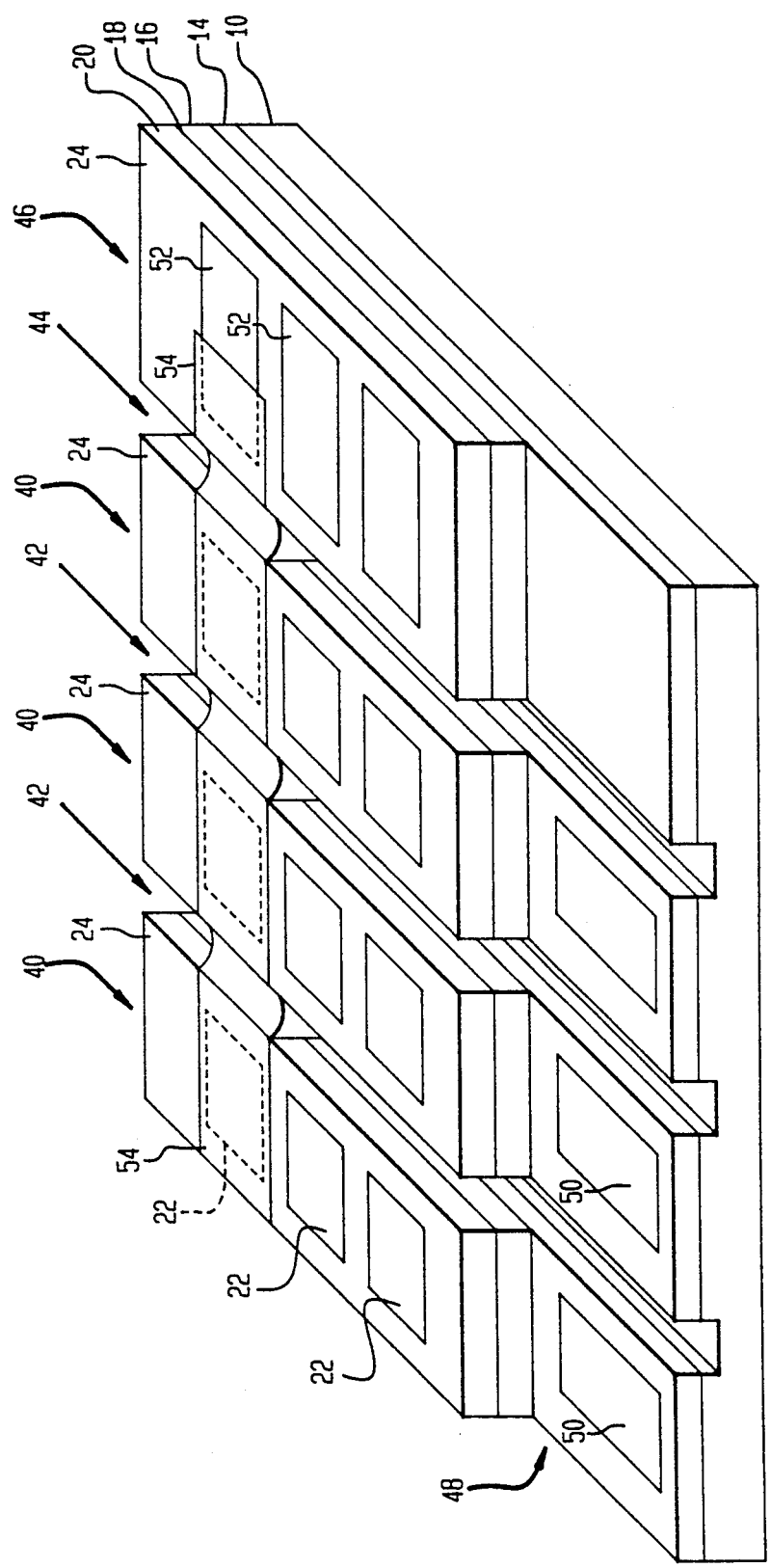
FIG. 4 is a perspective view of an embodiment of the invention providing a matrix addressable laser array.

An advantage of using the semi-insulating substrate 10 with an overlying n+ layer 14 is that the n+ layer 14 can be patterned to provide matrix addressable lasers, as illustrated in the perspective view of FIG. 4. A two dimensional array of lasers was fabricated according to the previously described proton implantation process. A single photoresist mask was used both for defining the gold electrodes 22 and as the implantation mask for all three proton implantations although the structure of FIG. 3 could easily be incorporated. Areas not covered by the electrodes 22 were all insulating regions 24.

Then rows 40 of lasers were isolated by photolithographically defining trenches 42 of width 20 μm and chemically etching with H₂O₂:H₂SO₄:H₂O (8:1:40 by volume) to a depth below the n+ layer 14 and thus penetrating into the semi-insulating substrate 10. Thereby, the bottom electrodes of the rows were electrically isolated. A trench 44 was simultaneously formed to isolate a row pad area 46. The trenches 42 and 44 were partially filled by spinning on 3.5 μm thick polyimide and then removing the polyimide by photolithography in the areas where contact to the underlying contact pads were required.

After formation of the trenches 42 and 44, a column pad area 48 providing contact to the n+ layer 14 was formed by photolithographic definition and etching with H₂O₂:H₂SO₄:H₂O (8:1:40 by volume) down to the n+ layer 10. Column pads 50 in the column pad area were defined by photolithography and depositing AuGe/Au to a thickness of 2.5 μm. Similarly row pads 52 in the row pad area 46 were defined by photolithography and depositing Cr/Au to a thickness of 2.5 μm. Metal leads 54 of Cr/Au and thickness 2 μm were deposited in the row direction to connect rows of the electrodes 22 to respective row pads 52. Only one of the row metal leads 54 is illustrated. The structures of the row and column pad areas 46 and 48 were replicated on the opposite lateral sides in order to increase reliability in the bonding process. Unillustrated lead wires can be bonded to respective column and row pads 50 and 52.

The contact structure of FIG. 4 allows for matrix addressing of any of the lasers. For an M×N laser array, only M+N leads are required to the M column pads 50 and the N row pads 52. By providing a power source across a selected column pad 50 and row pad 52, the laser at the intersection of the respective row and column is selected.

The matrix addressed laser array of FIG. 4 can be easily adapted to an optical data bus selector. For instance, in an N×32 laser array, a 32-bit wide data bus can be connected to the thirty-two column pads 50 and the N row pads 52 would serve as N-way selectors. The role of rows and columns can of course be reversed. The data transmitted optically may be either digital or analog since the light intensity increases substantially linearly with current above current threshold.

The invention of FIG. 4 was tested for 32×32 arrays. In an array, the individual lasers were of uniform size ranging from 10 to 40 μm in diameter and were spaced at 100 μm center to center. In the tests, the column and row pads 50 and 52 were contacted with conducting microprobes but wire bonds could be substituted in operational devices. The tests demonstrated high fabrication yields approaching 100% and high homogeneity (~5% deviations in threshold currents). Low threshold current densities of ~1000 A/cm² were obtained. The lasers operated CW without additional heat sinking.

The trenches 42 and 44 could be eliminated and the array made more planar by replacing the chemical trench etch with a deep (higher energy) ion implantation which would substantially convert the bottom mirror 16 and n+ layer 14 to insulating.

The invention provides a planar array of surface-emitting lasers which have been shown to be uniform, of narrow bandwidth and highly efficient. Their fabrication is simple and their planarity provides easy application of leads. In particular, a large number of such lasers may be fabricated with matrix-addressable leads.

What is claimed is:

1. A surface-emitting laser array, comprising:
   a vertical semiconductor structure formed over a conducting crystalline body, said structure including
   a lower Bragg reflector for at least partially reflecting light at a wavelength,
   an active region for emitting said light at said wavelength, and
   an upper Bragg reflector for at least partially reflecting said light at said wavelength and separated from said lower Bragg reflector by a distance having a predetermined relationship to said wavelength;
   an array of electrical electrodes formed over said upper Bragg reflector for establishing electrical paths from said electrodes to said conducting body; and
   a dopant for reducing an electrical conductance of said semiconductor structure introduced into a current confining region extending substantially from an upper surface of said upper Bragg reflector to said active region in areas between said electrodes.

2. A laser array as recited in claim 1, wherein said active region comprises at least one quantum well.

3. A laser array as recited in claim 1, wherein said current confining region surrounds a conducting region of said upper Bragg reflector below a respective one of said electrodes having a first cross-sectional area near a top of said upper Bragg reflector and a second cross-sectional area near a bottom of said upper Bragg reflector substantially smaller than said first cross-sectional area.

4. A laser array as recited in claim 1, wherein said dopant comprises protons.

5. A laser array as recited in claim 1, wherein said conducting crystalline body comprises an insulating substrate and a conducting crystalline layer formed thereover.

6. A laser array as recited in claim 5, wherein said conducting layer is separated into parallel stripes separated by a non-conductor, said array further comprising electrical contacts applied to upper surfaces of said conducting layer in respective ones of said parallel stripes.

7. A laser array, comprising:
   an insulating substrate;
   a conducting, crystalline layer formed on said substrate;
   parallel, non-conducting channels separating stripes of said conducting, crystalline layer;
   a two-dimensional array of vertical-cavity, surface-emitting semiconductor diode lasers formed on said conducting, crystalline layer and arranged in one-dimensional arrays of said lasers on respective ones of said stripes; and
   a plurality of parallel conducting leads arranged perpendicularly to said channels and each electrically contacting a plurality of said lasers.

8. A laser array as recited in claim 7, wherein each of said diode laser comprises a lower Bragg reflector, an active region and an upper Bragg reflector separated from said lower Bragg reflector by a distance having a predetermined relationship to a wavelength of light emitted by said active region, said laser array further comprising a dopant for reducing an electrical conductance introduced into a material surrounding said upper Bragg reflector.

9. A surface-emitting laser array as recited in claim 1, wherein said crystalline body comprises a substrate unpatterned between a first portion underlying said current confining region and a second portion surrounded by said first portion.

* * * * *